United States Patent
Xiao et al.

(10) Patent No.: US 12,309,998 B2
(45) Date of Patent: May 20, 2025

(54) SEMICONDUCTOR STRUCTURE AND METHOD FOR MANUFACTURING SEMICONDUCTOR STRUCTURE

(71) Applicant: CHANGXIN MEMORY TECHNOLOGIES, INC., Hefei (CN)

(72) Inventors: Deyuan Xiao, Hefei (CN); Yi Jiang, Hefei (CN); Guangsu Shao, Hefei (CN); Xingsong Su, Hefei (CN); Yunsong Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 484 days.

(21) Appl. No.: 17/949,580

(22) Filed: Sep. 21, 2022

(65) Prior Publication Data

US 2023/0020173 A1    Jan. 19, 2023

Related U.S. Application Data

(63) Continuation of application No. PCT/CN2022/096424, filed on May 31, 2022.

(30) Foreign Application Priority Data

May 20, 2022   (CN) .......................... 202210557400.7

(51) Int. Cl.
   *H10B 12/00*   (2023.01)
(52) U.S. Cl.
   CPC ........... *H10B 12/05* (2023.02); *H10B 12/315* (2023.02); *H10B 12/482* (2023.02); *H10B 12/488* (2023.02)
(58) Field of Classification Search
   CPC .... H10B 12/05; H10B 12/315; H10B 12/482; H10B 12/488; H10D 30/025; H10D 30/63
   See application file for complete search history.

(56) References Cited

U.S. PATENT DOCUMENTS

| 2009/0166872 A1 | 7/2009 | Chung |
| 2012/0012927 A1* | 1/2012 | Uchiyama ............ H10B 12/482 257/330 |

(Continued)

FOREIGN PATENT DOCUMENTS

| CN | 100561740 C | 11/2009 |
| CN | 102522407 A | 6/2012 |

(Continued)

OTHER PUBLICATIONS

International Search Report for Application No. PCT/CN2022/096424 mailed on Dec. 29, 2022.

(Continued)

*Primary Examiner* — Yasser A Abdelaziz
(74) *Attorney, Agent, or Firm* — Syncoda LLC; Feng Ma

(57) ABSTRACT

A semiconductor structure and a method for manufacturing a semiconductor structure are provided. The method for manufacturing the semiconductor structure includes: a substrate is provided: a plurality of semiconductor channels arrayed in a first direction and a second direction are formed on the substrate: a plurality of bit lines extending in the first direction are formed, in which the bit lines is located in the substrate: and a plurality of word lines extending in the second direction are formed, in which two word lines adjacent to each other in the first direction are spaced apart from each other in a direction perpendicular to a surface of the substrate: and a sidewall conductive layer is formed, in which the sidewall conductive layer is located above one of the two word lines adjacent to each other, and is arranged in the same layer as the other of the two word lines.

20 Claims, 17 Drawing Sheets

(56) References Cited

U.S. PATENT DOCUMENTS

| | | | | |
|---|---|---|---|---|
| 2012/0119286 A1* | 5/2012 | Kim | ................... | H10D 62/378 |
| | | | | 257/329 |
| 2020/0295008 A1 | 9/2020 | Tang et al. | | |
| 2021/0074334 A1 | 3/2021 | Zhu | | |
| 2021/0074705 A1 | 3/2021 | Tang et al. | | |
| 2022/0285362 A1* | 9/2022 | Fishburn | .............. | H10B 12/482 |
| 2023/0128761 A1* | 4/2023 | Jang | ................... | H10D 30/031 |
| | | | | 257/296 |

FOREIGN PATENT DOCUMENTS

| | | |
|---|---|---|
| CN | 109285838 A | 1/2019 |
| CN | 114023703 A | 2/2022 |
| CN | 114141712 A | 3/2022 |
| CN | 114156236 A | 3/2022 |
| WO | 2013091374 A1 | 6/2013 |

OTHER PUBLICATIONS

Written Opinion for Application No. PCT/CN2022/096424 mailed on Dec. 29, 2022.
International Search Report for Application No. PCT/CN2022/096758 mailed on Dec. 16, 2022.
Written Opinion for Application No. PCT/CN2022/096758 mailed on Dec. 16, 2022.

\* cited by examiner

SEMICONDUCTOR STRUCTURE AND METHOD FOR MANUFACTURING SEMICONDUCTOR STRUCTURE

CROSS-REFERENCE TO RELATED APPLICATIONS

This application is a continuation application of International Patent Application No. PCT/CN2022/096424, filed on May 31, 2022, which claims priority to Chinese Patent Application No. 202210557400.7, filed on May 20, 2022. The disclosures of these applications are hereby incorporated by reference in their entirety.

BACKGROUND

With the development of the integration density of dynamic memories towards a higher direction, it is necessary to improve the electrical performance of functional devices with small dimension while the configuration manner of transistors in a dynamic memory array structure and how to reduce the dimension of individual functional devices in the dynamic memory array structure are studied.

When a vertical Gate-All-Around (GAA) transistor structure serves as an access transistor of the dynamic memory, the occupied area thereof may reach $4F^2$ (F: the smallest feature dimension available under a given process condition), and in principle, higher density efficiency may be implemented.

However, at present, there is a strong coupling effect between adjacent word lines.

SUMMARY

Embodiments of the present disclosure relate to the field of semiconductors, in particular to a semiconductor structure and a method for manufacturing a semiconductor structure.

The embodiments of the disclosure provide a semiconductor structure and a method for manufacturing a semiconductor structure.

According to some embodiments of the present disclosure, an aspect of the embodiments of the present disclosure provides a method for manufacturing a semiconductor structure, which includes the following operations. A substrate is provided. A plurality of semiconductor channels arrayed in a first direction and a second direction are formed on the substrate. A plurality of bit lines extending in the first direction are formed, in which the plurality of bit lines are located in the substrate, and each of the plurality of bit lines is electrically connected to a first plurality of semiconductor channels arranged in the first direction. A plurality of word lines extending in the second direction are formed, in which each of the plurality of word lines wraps a part of a side surface of each of a second plurality of semiconductor channels arranged in the second direction, and two word lines adjacent to each other in the first direction are spaced apart from each other in a direction perpendicular to a surface of the substrate. A sidewall conductive layer is formed, in which the sidewall conductive layer is located above one of the two word lines adjacent to each other, and the sidewall conductive layer is arranged in the same layer with the other of the two word lines adjacent to each other.

According to some embodiments of the present disclosure, another aspect of the embodiments of the present disclosure provides a semiconductor structure, which includes: a substrate as well as a plurality of semiconductor channels arrayed in a first direction and a second direction and formed on the substrate; a plurality of bit lines extending in the first direction, in which the plurality of bit lines are located in the substrate, and each of the plurality of bit lines is electrically connected to a first plurality of semiconductor channels arranged in the first direction; a plurality of word lines extending in the second direction, in which each of the plurality of word lines wraps a part of a side surface of each of a second plurality of semiconductor channels arranged in the second direction, in which two word lines adjacent to each other in the first direction are spaced apart from each other in a direction perpendicular to a surface of the substrate; and a sidewall conductive layer, in which the sidewall conductive layer is located above one of the two word lines adjacent to each other, and the sidewall conductive layer is arranged in the same layer as the other of the two word lines adjacent to each other.

BRIEF DESCRIPTION OF THE DRAWINGS

One or more embodiments are exemplified by the pictures in the corresponding drawings. These exemplary descriptions do not constitute a limitation on the embodiments. Unless otherwise stated, the figures in the drawings do not constitute a proportion limit. One or more embodiments are exemplified by the pictures in the corresponding drawings. These exemplary descriptions do not constitute a limitation on the embodiments. Unless otherwise stated, the figures in the drawings do not constitute a proportion limit. In order to describe the technical solutions in the embodiments of the disclosure or in the related art more clearly, the drawings required to be used in descriptions about the embodiments or the related art will be simply introduced below. Obviously, the drawings described below are some embodiments of the disclosure, and other drawings may further be obtained by those of ordinary skill in the art according to the drawings without creative work.

DETAILED DESCRIPTION

The embodiments of the disclosure provide a method for manufacturing a semiconductor structure. After a substrate, a semiconductor channel and a bit line are formed, adjacent word lines are arranged at intervals in a direction perpendicular to a surface of the substrate, so that the spacing between adjacent word lines may be increased. Accordingly, the spacing between the word lines is increased, and the insulation performance between adjacent word lines is improved, so that the coupling effect between adjacent word lines can be improved. By arranging a sidewall conductive layer, a shielding role may also be achieved, and then the reliability of the semiconductor structure is improved.

Various embodiments of the present disclosure will now be described in detail in combination with the accompanying drawings. However, it is to be understood by those of ordinary skill in the art that in the various embodiments of the disclosure, many technical details have been proposed in order to make a reader better understand the embodiments of the disclosure. However, even without these technical details and various variations and modifications based on the following embodiments, the technical solutions claimed in the embodiments of the disclosure may also be implemented.

Figure 1:
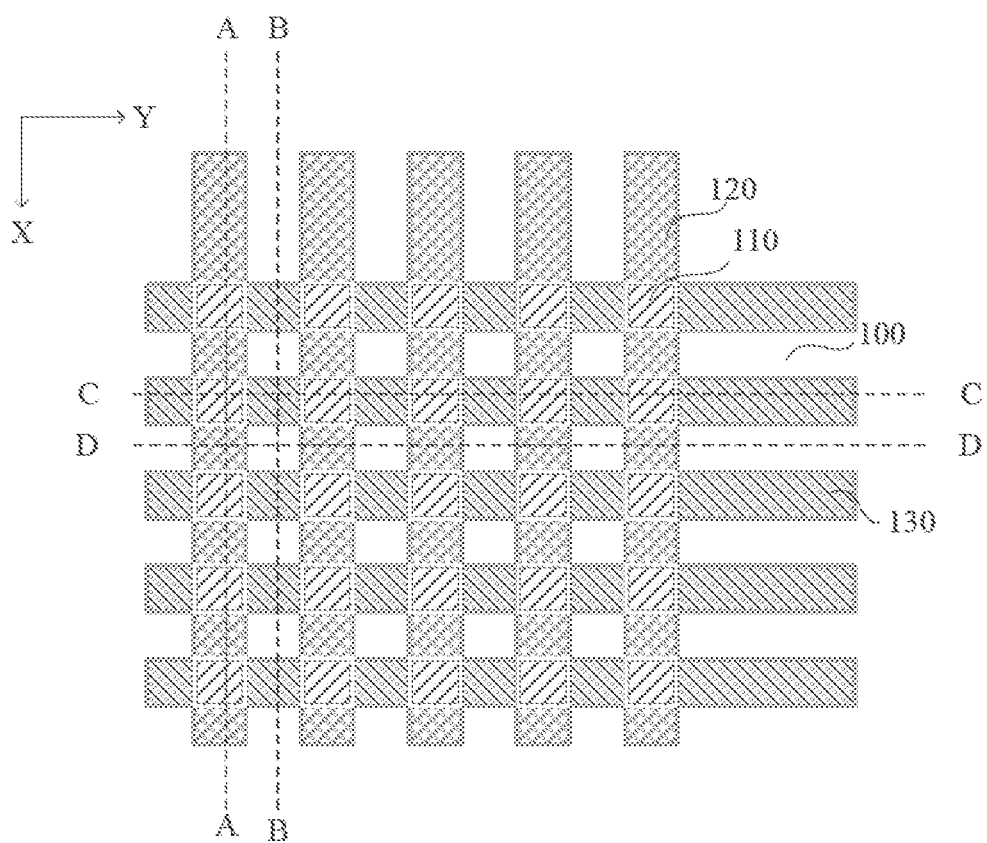
FIG. 1 is a top view of a semiconductor structure according to an embodiment of the disclosure.
Figure 2:
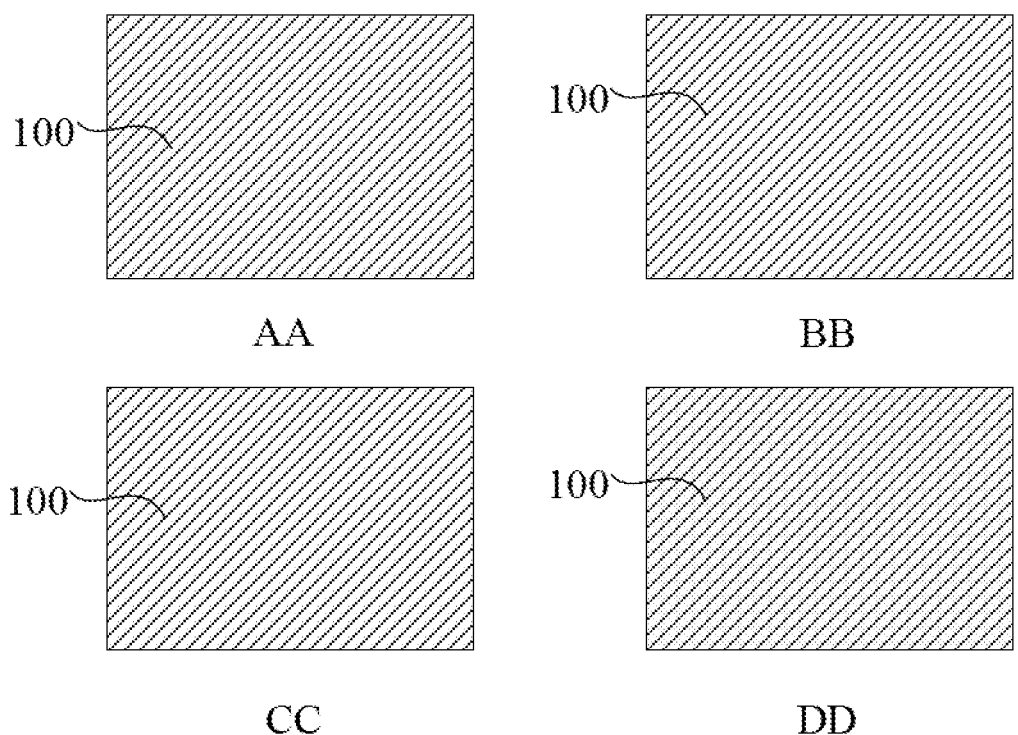
FIG. 2 to FIG. 16 are schematic diagrams of a semiconductor structure corresponding to operations of a method for manufacturing a semiconductor structure according to an embodiment of the disclosure.

With reference to FIG. 1 and FIG. 2, FIG. 1 is a top view of a semiconductor structure according to an embodiment of the disclosure. FIG. 2 is a section view of a method for manufacturing a semiconductor structure according to an embodiment of the present disclosure in directions AA. BB, CC and DD in FIG. 1.

With reference to FIG. 1, a substrate 100 is provided. A plurality of semiconductor channels 110 arrayed in a first direction X and a second direction Y are formed on the substrate 100. A plurality of bit lines 120 extending in the first direction X are formed, the bit lines 120 are located in the substrate 100, and each of the plurality of bit lines 120 is electrically connected to a first plurality of semiconductor channels 110 arranged in the first direction X. A plurality of word lines 130 extending in the second direction Y are formed, and each of the plurality of word lines 130 wraps a part of a side surface of each of a second plurality of semiconductor channels 110 arranged in the second direction Y. Herein, two word lines 130 adjacent to each other in the first direction X are spaced apart from each other in a direction perpendicular to the surface of the substrate 100.

It is to be understood that FIG. 1 is a top view of a semiconductor structure. The top view does not show how the adjacent word lines 130 are spaced apart from each other in the direction perpendicular to the surface of the substrate 100. Actually, two adjacent word lines 130 are spaced apart from each other in the direction perpendicular to the surface of the substrate 100.

For example, with reference to FIG. 2, a substrate 100 is provided. In some embodiments, the type of the material of the substrate 100 may be an elemental semiconductor material or a crystalline inorganic compound semiconductor material. The elemental semiconductor material may be silicon or germanium. The crystalline inorganic compound semiconductor material may be silicon carbide, silicon germanium, gallium arsenide, or indium gallium arsenide, etc.

Figure 3:
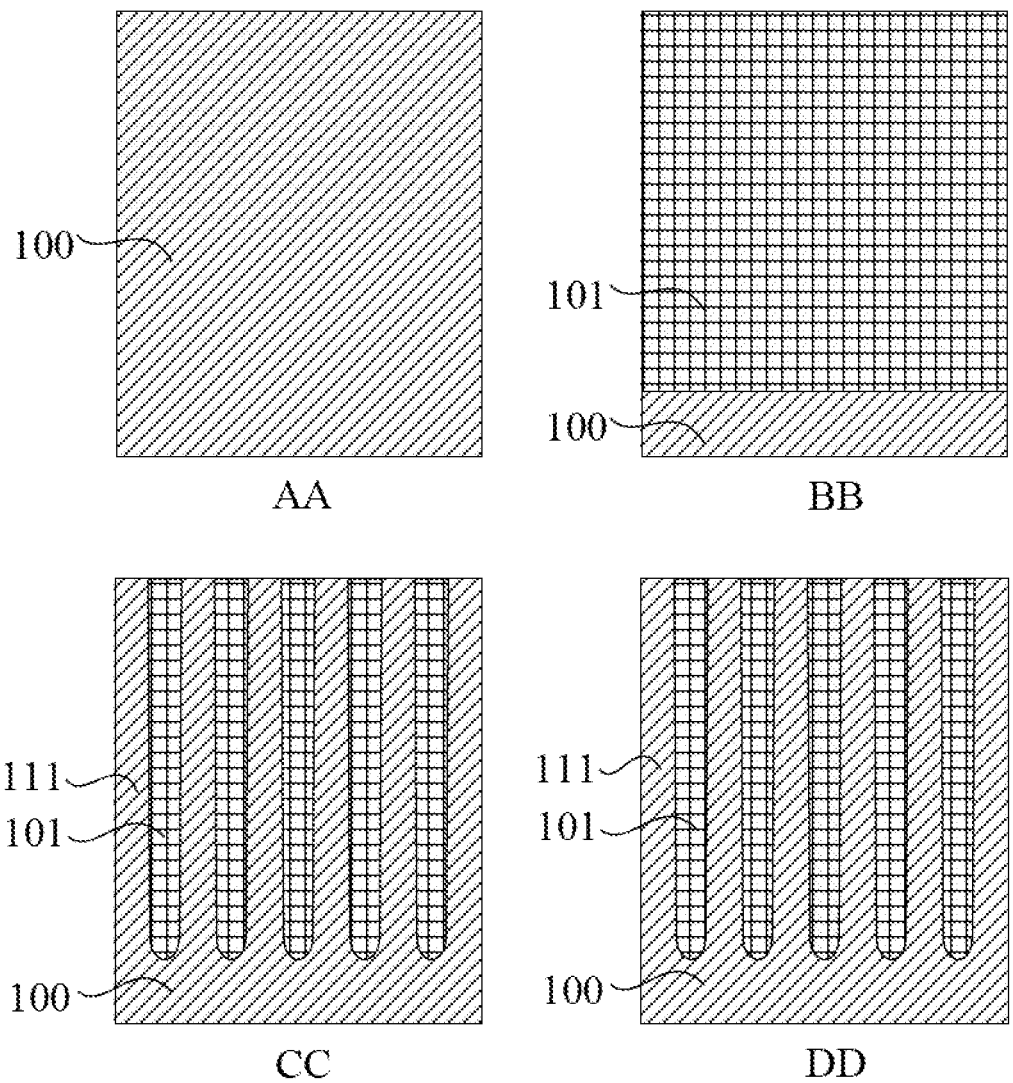
Figure 4:
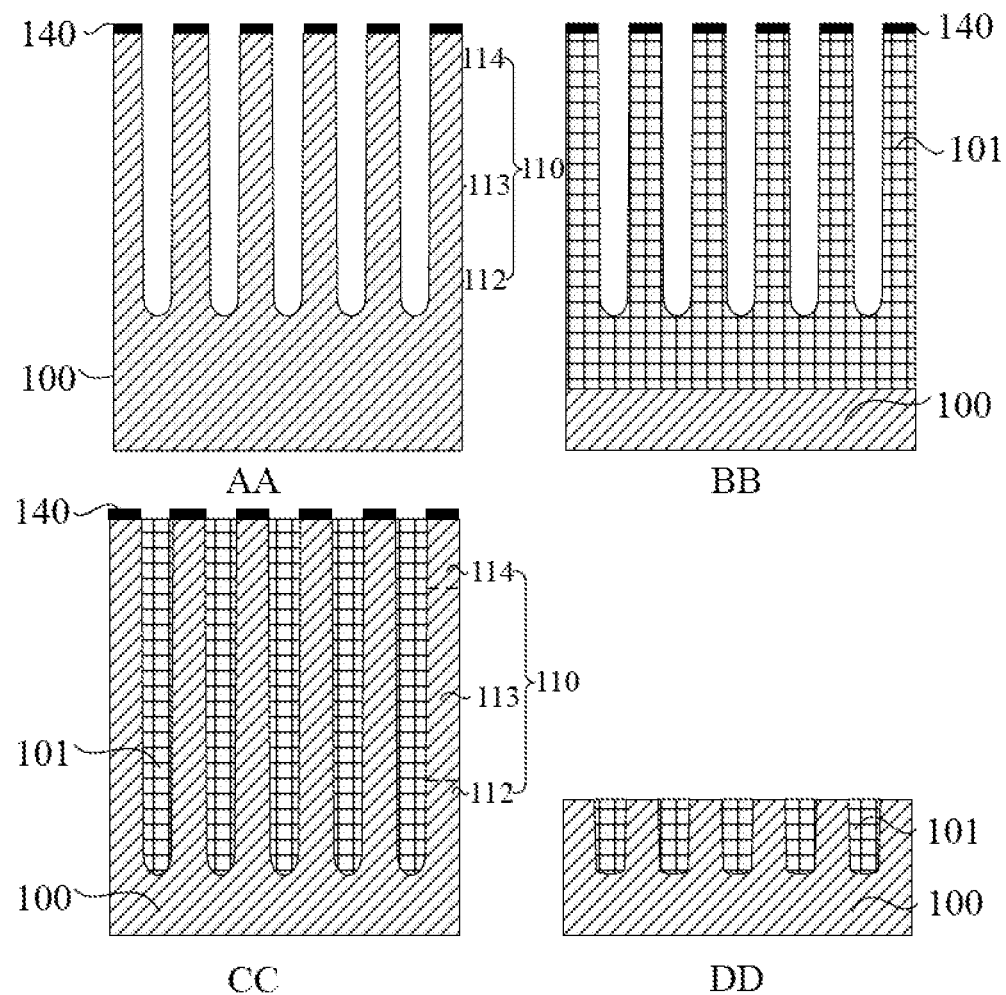

With reference to FIG. 3 and FIG. 4, FIG. 3 and FIG. 4 are section views of manufacturing operations of a method for manufacturing a semiconductor structure according to embodiments of the present disclosure based on FIG. 2.

With reference to FIG. 3 and FIG. 4, a plurality of semiconductor channels 110 arrayed in a first direction X and a second direction Y are formed.

For example, with reference to FIG. 3, a substrate 100 is patterned to form a plurality of initial semiconductor channels 111 spaced apart from each other in the second direction.

In some embodiments, the substrate 100 may be patterned by forming a mask on the surface of the substrate 100 and then etching the substrate through the mask, to form the plurality of initial semiconductor channels 111.

In some embodiments, after the plurality of initial semiconductor channels 111 are formed, grooves between the plurality of initial semiconductor channels 111 are filled to form an isolation structure 101. For example, oxide may be employed for filling. The isolation structure 101 may be called Shallow Trench Isolation (STI).

With reference to FIG. 4, the plurality of initial semiconductor channels 111 are patterned to form a plurality of semiconductor channels 110 spaced apart from each other in each of the first direction and the second direction.

In some embodiments, the semiconductor channels 110 may be formed by Self-Aligned Double Patterning (SADP), and the formed semiconductor channels 110 may be made more accurate by SADP.

In some embodiments, after the plurality of initial semiconductor channels 111 are formed, a first mask layer 140 is formed on top surfaces of the plurality of initial semiconductor channels 111, and the plurality of initial semiconductor channels 111 are etched downward along the first mask layer 140 to form the plurality of semiconductor channels 110 spaced apart from each other in each of the first direction X and the second direction Y. For example, the first mask layer 140 is an oxide layer, and an oxide is deposited on the top surfaces of the plurality of semiconductor channels 110 or a part of each of the top surfaces of the plurality of semiconductor channels 110 is oxidized to form the first mask layer 140.

Each of the semiconductor channels 110 includes a first doped region 112, a channel region 113, and a second doped region 114 which are sequentially arranged, and the first doped region 112 is electrically connected to one of the plurality of bit lines. For example, after the semiconductor channels 110 are formed, ion doping may be performed on the semiconductor channels 110 to form the first doped region 112, the channel region 113 and the second doped region 114, and the types of the doped ions s are the same. A junctionless transistor may be formed by doping each of the semiconductor channels 110 with the same type of ions, and the junctionless transistor means that the type of the doped ions in the first doped region 112, the type of the doped ions in the channel region 113 and the type of the doped ions in the second doped region 114 are the same. For example, the doped ions are all N-type ions, and further, the doped ions in the first doped region 112, the doped ions in the channel region 113 and the doped ions in the second doped region 114 may be the same. Here, "junctionless" means no PN junction. That is, there is no PN junction in the transistor formed by the semiconductor channel 110. The device is a junctionless transistor, which facilitates avoiding the phenomenon of making an ultra-steep PN junction in a nanometer scale by adopting an ultra-steep source-drain concentration gradient doping process. Therefore, this avoids problems such as threshold voltage drift and leakage current increase caused by doping mutation, and suppresses the short-channel effect, and thus the device can still work in the scale range of a few nanometers, thus facilitating further improvement of the integration density and electrical properties of the semiconductor structure. It is to be understood that additional doping here refers to a doping which is performed in order to make the type of doped ions of the first doped region 112 and the type of doped ions of the second doped region 114 different from the type of doped ions of the channel region 113.

In some embodiments, ion implantation is performed in the first doped region 112 (that is, the part of the semiconductor channel 110 where the first doped region 112 is formed) in a high-energy manner, in which the ion concentration of the first doped region 112 is higher. Then, ion implantation is performed in the channel region 113 and the second doped region 114 (that is, the part of the semiconductor channel 110 where the channel region 113 is formed and the part of the semiconductor channel 110 where the second doped region 114 is formed) in a low-energy manner, in which the ion concentration of the channel region 113 and the ion concentration of the second doped region 114 are lower. The ion concentration of the second doped region 114 (the part of the semiconductor channel 110 where the second doped region 114 is formed) is increased by performing ion implantation in the second doped region 114, so that the ion concentration of the second doped region 114 is higher.

It is to be noted that the substrate 100 may be doped before the semiconductor channels 110 are formed, and accordingly, after the semiconductor channels 110 are formed, each of the semiconductor channels 110 is provided with the first doped region 112, the channel region 113 and the second doped region 114 which are sequentially arranged.

In some embodiments, in the direction perpendicular to the substrate 100, the length of the channel region 113 is greater than or equal to the sum of the lengths of adjacent word lines. That is, the top surface of the channel region 113 is higher than or flush with the top surface of an upper word line, and the bottom surface of the channel region 113 is lower than or flush with the bottom surface of a lower word line.

Figure 5:
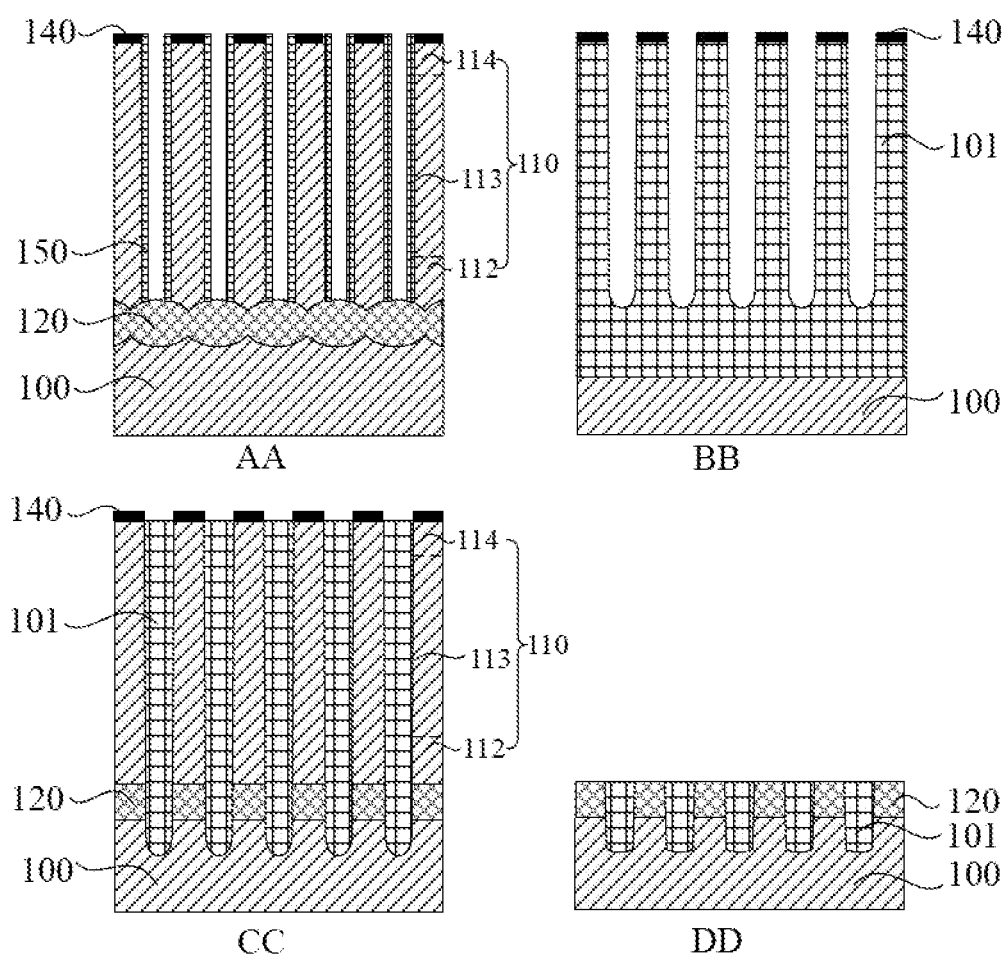

With reference to FIG. 5, a plurality of bit lines 120 extending in the first direction X are formed, the plurality of bit lines 120 are located in the substrate 100, and each of the plurality of bit lines 120 is electrically connected to a first plurality of semiconductor channels 110 arranged in the first direction X.

In some embodiments, before the bit lines 120 are formed, a first sidewall layer 150 is formed on a sidewall of the first mask layer 140 and sidewalls of the semiconductor channels 110. The formation of the first sidewall layer 150 may avoid the influence on the semiconductor channels 110 in the subsequent formation of the bit lines 120.

In some embodiments, the material of the semiconductor channels is silicon, and a plurality of bit lines 120 are formed by a silicide process. For example, the method of forming the bit lines 120 may include the following operations. Metal layers (not shown in the figure) are formed, in which the metal layers are filled and located between adjacent semiconductor channels 110, and the metal layers are spaced apart from each other in the second direction. The metal layers are subjected to first rapid thermal annealing treatment, cleaning treatment (to remove an unreacted metal layer) and second rapid thermal annealing treatment to form metal silicide in the substrate 100, in which the metal silicide serves as the bit lines 120. That is, the bit lines 120 are formed by a metal silicidation process. The contact resistance of the bit line 120 may be reduced by the metal silicidation process and the defects between the bit line 120 and the substrate 100 may be reduced by metal silicidation, thereby improving the performance of the semiconductor structure.

With reference to FIG. 6 to FIG. 15. FIG. 6 to FIG. 15 are schematic diagrams of manufacturing operations of a method for manufacturing a semiconductor structure according to embodiments of the present disclosure based on FIG. 5.

For example, the plurality of semiconductor channels 110 include a plurality of columns of first channel groups and a plurality of columns of second channel groups. Each column of the first channel groups includes a plurality of first semiconductor channels arranged in the second direction. Each column of the second channel groups includes a plurality of second semiconductor channels arranged in the second direction. The plurality of columns of first channel groups and the plurality of columns of second channel groups are alternately arranged in the first direction. The plurality of word lines 130 include a plurality of first word lines 131 extending in the second direction and a plurality of second word lines 132 extending in the second direction.

Each of the plurality of first word lines 13 wraps a part of a side surface of each of the plurality of first semiconductor channels 110 in a corresponding column of first channel groups among the plurality of columns of first channel groups. Each of the plurality of second word lines wraps a part of a side surface of each of the plurality of second semiconductor channels 110 in a corresponding column of second channel groups among the plurality of columns of second channel groups. The distance between the bottom surface of each of the plurality of second word lines 132 and the surface of the substrate 100 is greater than the distance between the bottom surface of each of the plurality of first word lines 131 and the surface of the substrate 100. The operation that the plurality of word lines 130 are formed includes the following operation. The plurality of first word lines 131 are formed, and the plurality of second word lines 132 are formed.

The coupling effect between adjacent word lines 130 may be reduced by forming the first word line 131 and the second word line 132 which are spaced apart from each other. The spacing between adjacent word lines 130 (that is, adjacent first word lines 131 and/or adjacent second word lines 132) facing each other in the same plane may also be increased by forming the first word line 131 and the second word line 132 which are spaced apart from each other. The coupling effect between adjacent word lines 130 facing each other in the same plane may be reduced by increasing the spacing between adjacent word lines 130 facing each other in the same plane, thus avoiding the situation that when any word line 130 of the adjacent word lines 130 facing each other in the same plane is activated, the other word line 130 of the adjacent word lines 130 facing each other in the same plane is activated, thereby increasing the reliability of the semiconductor structure.

For example, with reference to FIG. 6 to FIG. 10, the operation that the first word lines 131 are formed may include the following operations. First trenches 180 are formed, in which each of the first trenches 180 exposes the part of the side surface of each of the plurality of first semiconductor channels in one column. First initial word lines 133 are formed, in which the first initial word lines 133 fully fill the first trenches 180, The first initial word lines 133 are patterned, in which retaining parts of the first initial word lines 133 serve as the first word lines 131. The first initial word lines 133 are formed by filling the first trenches 180, and then the first word lines 131 are formed by patterning, so that the height of each of the top surfaces of the formed first word lines 131 may be well controlled, and thus the performance of the sidewall conductive layer may be prevented from being influenced by the small space subsequently left for the sidewall conductive layer.

Figure 6:
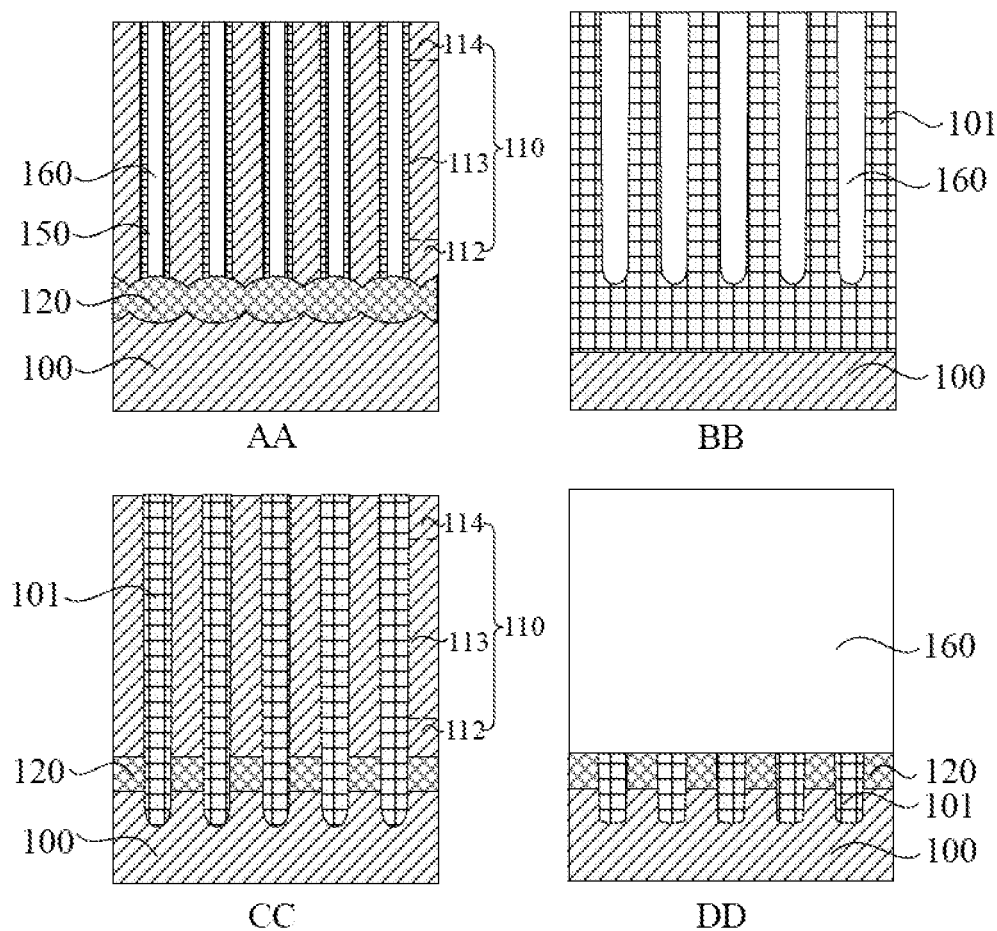
Figure 7:
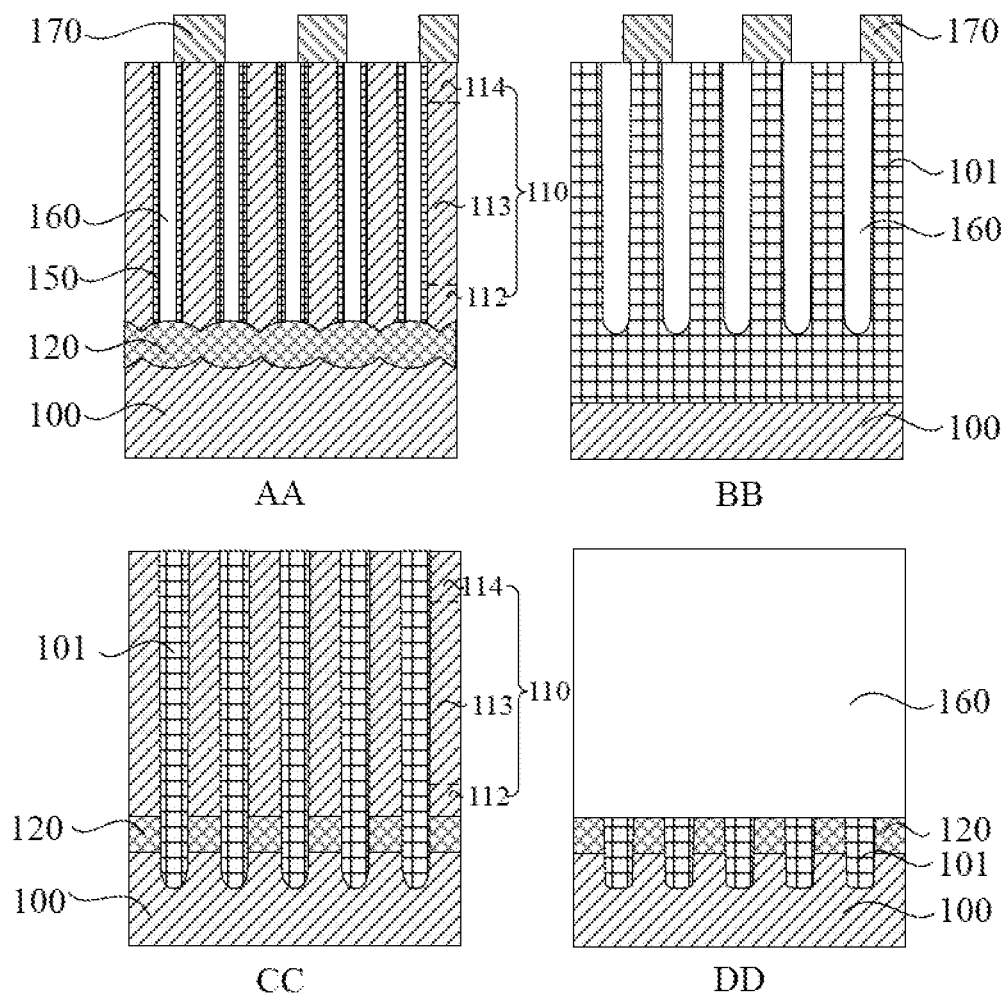
Figure 8:
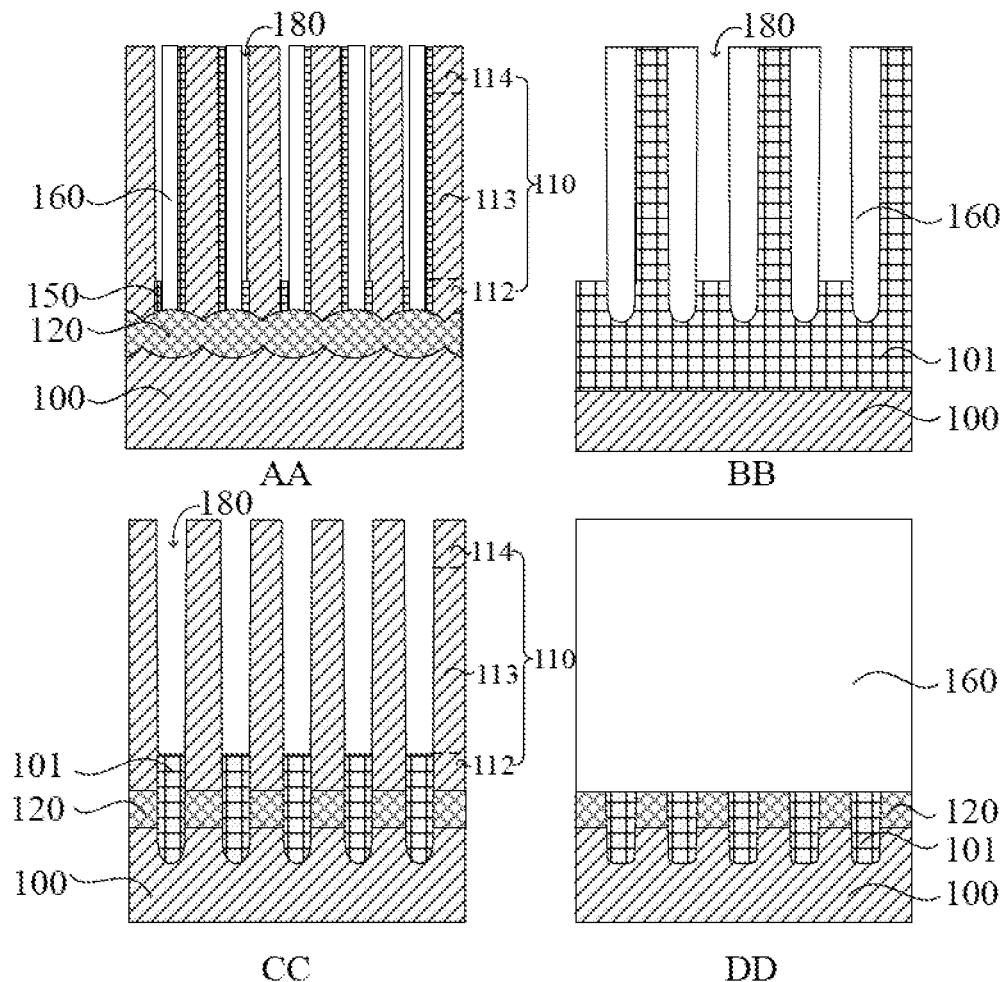

For example, with reference to FIG. 6 to FIG. 8, the operation that the first trenches 180 are formed includes the following operations. A first sidewall layer 150 is formed, in which the first sidewall layer 150 covers the sidewalls, which are spaced apart from each other in the first direction, of the semiconductor channels 110. A mask layer 170 is formed, in which the mask layer 170 covers the second semiconductor channels and the first sidewall layer 150 located on the sidewalls of the second semiconductor channels. The first sidewall layer 150 is patterned with the mask layer 170 as a mask so as to form the first trenches 180.

For example, with reference to FIG. 6, after the first sidewall layer 150 is formed, a first filling layer 160 is formed between the first sidewall layers 150. The material of the first sidewall layer 150 may be oxide, such as silicon oxide, and the material of the first filling layer 160 may be nitride, such as silicon nitride.

In some embodiments, the operation of forming the first filling layer 160 further includes the following operations. A first initial filling layer is formed, in which the first initial filling layer also covers the top surfaces of the semiconductor channels 110. A part of the first initial filling layer is removed by Chemical Mechanical Polishing (CMP) to expose the top surfaces of the semiconductor channels 110, in which a retaining part of the first initial filling layer serves as the first filling layer 160.

With reference to FIG. 7, the mask layer 170 is formed. A process basis is provided for the subsequent formation of the first trenches by forming the mask layer 170. By forming the mask layer 170, the space for subsequent formation of the second word lines may be protected, and a process basis is provided for subsequent formation of the first word lines and the second word lines spaced apart from the first word lines.

In other embodiments, the mask layer may only cover the first semiconductor channels and the first sidewall layer located on the sidewalls of the first semiconductor channels. The disclosure does not limit the position of the mask layer, as long as the mask layer covers the top surfaces of the same channel group and the first sidewall layer located on the sidewalls of the channel group.

With reference to FIG. 8, first trenches 180 are formed, and after the first trenches 180 are formed, the mask layer 170 is removed. The first trenches 180 do not expose the top surfaces of the bit lines 120. That is, in the process of patterning the first sidewall layer 150, a part of the first sidewall layer 150 is still retained, to prevent the connection of the first word lines formed subsequently to the bit lines 120.

Figure 9:
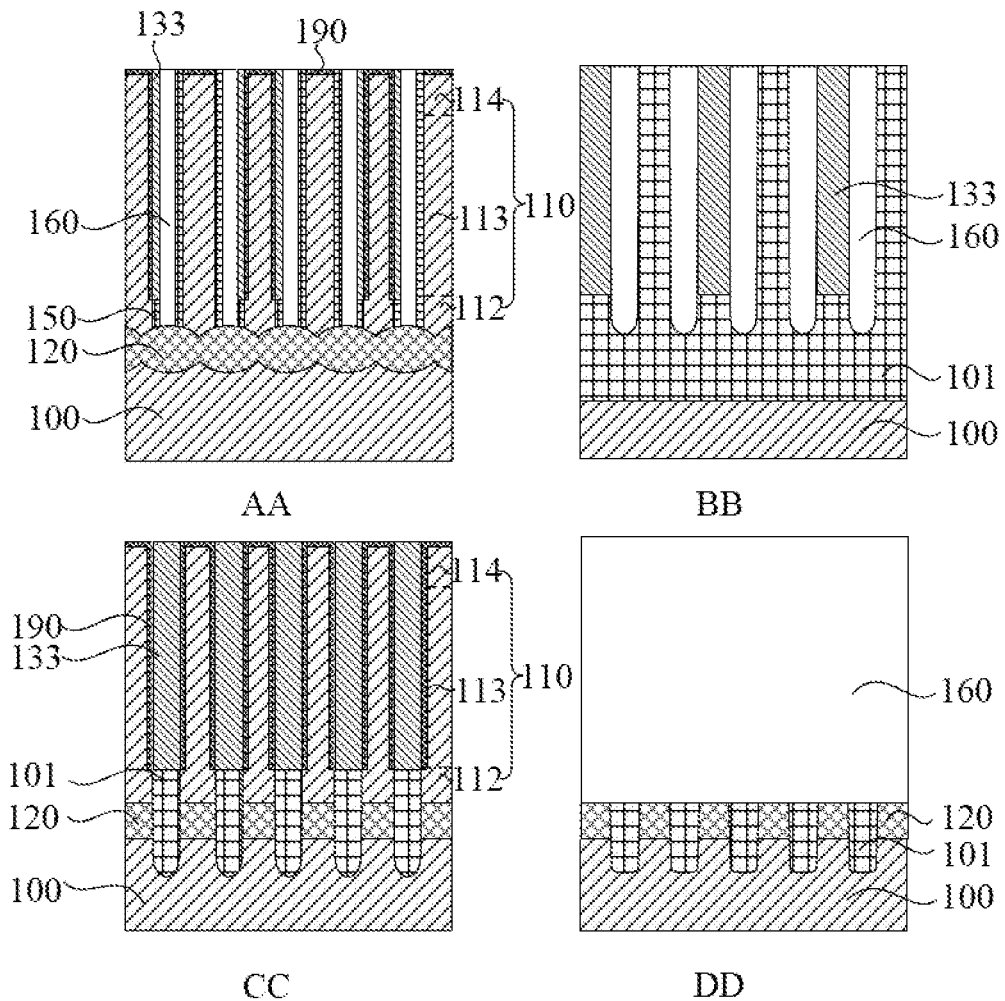

With reference to FIG. 9, the first initial word lines 133 are formed. Before the first initial word lines 133 are formed, a first gate oxide layer 190 is formed. The first initial word lines 133 may be prevented from directly contacting the substrate 100 by forming the first gate oxide layer 190.

In some embodiments, the formation of the first gate oxide layer 190 may include the following operation. A part of the semiconductor channels 110 is thermally oxidized to form first gate oxide layer 190, and a formation space where the first initial word lines 133 are formed may be provided by means of oxidation. That is, the space of the first trenches 180 (with reference to FIG. 8) is not fully occupied by the formed first gate oxide layer 190, so that the volume of the first initial word line 133 may be increased, the resistance of the first initial word line 133 may be reduced, and the performance of the semiconductor structure may be improved. Of course, the first gate oxide layer 190 may also be formed by deposition.

In some embodiments, in the process of forming the first initial word lines 133, the first initial word lines 133 may cover the top surface of the first filling layer 160. The top surfaces of the first initial word lines 133 may be flush with the top surface of the first filling layer 160 by CMP. The material of the first initial word line 133 may be titanium nitride or tungsten, etc.

Figure 10:
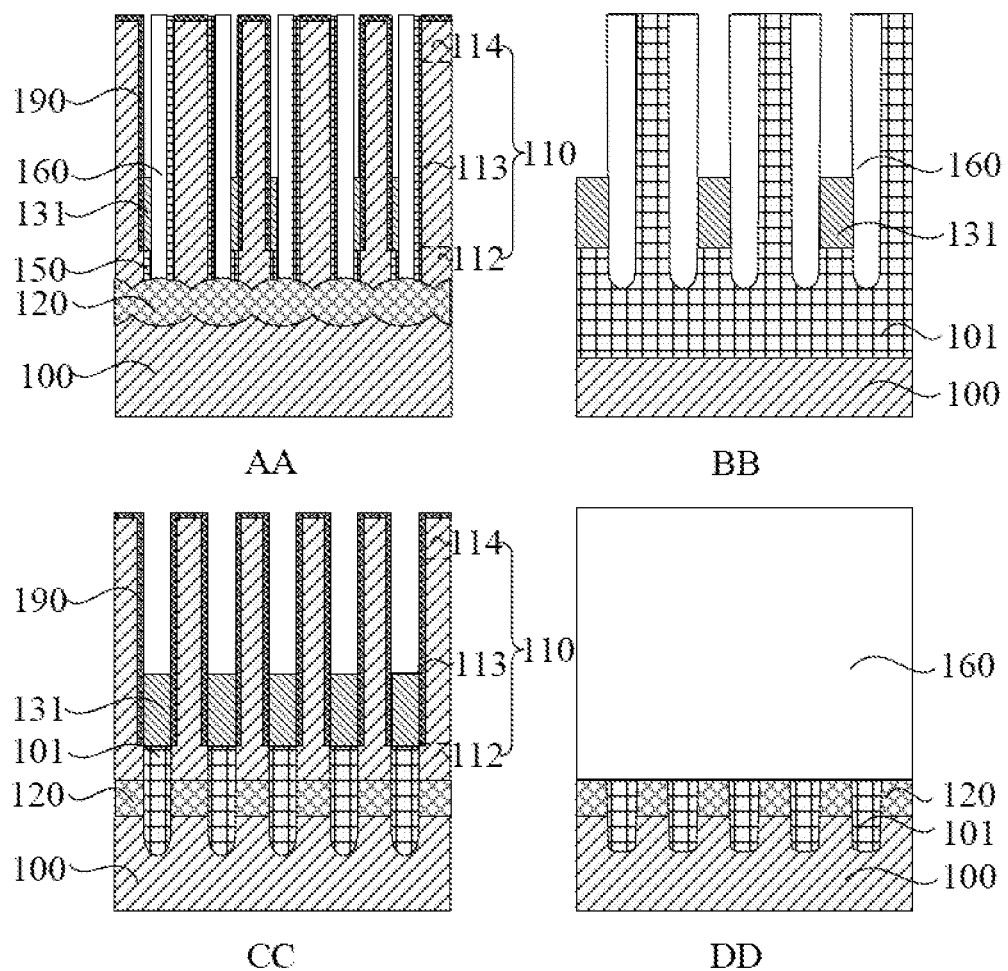

With reference to FIG. 10, first word lines 131 are formed, part of each of the first initial word lines 133 may be removed by etching back the first initial word lines 133, in which retaining parts of the first initial word lines 133 (with reference to FIG. 9) serve as the first word lines 131.

With reference to FIG. 11 to FIG. 15, the second word lines 132 and the sidewall conductive layer 240 are simultaneously formed. The coupling effect between adjacent word lines may be reduced by forming the second word lines 132 spaced from the first word lines 131. The shielding effect may be provided by forming the sidewall conductive layer 240, thereby improving the performance of the semiconductor structure.

Figure 11:
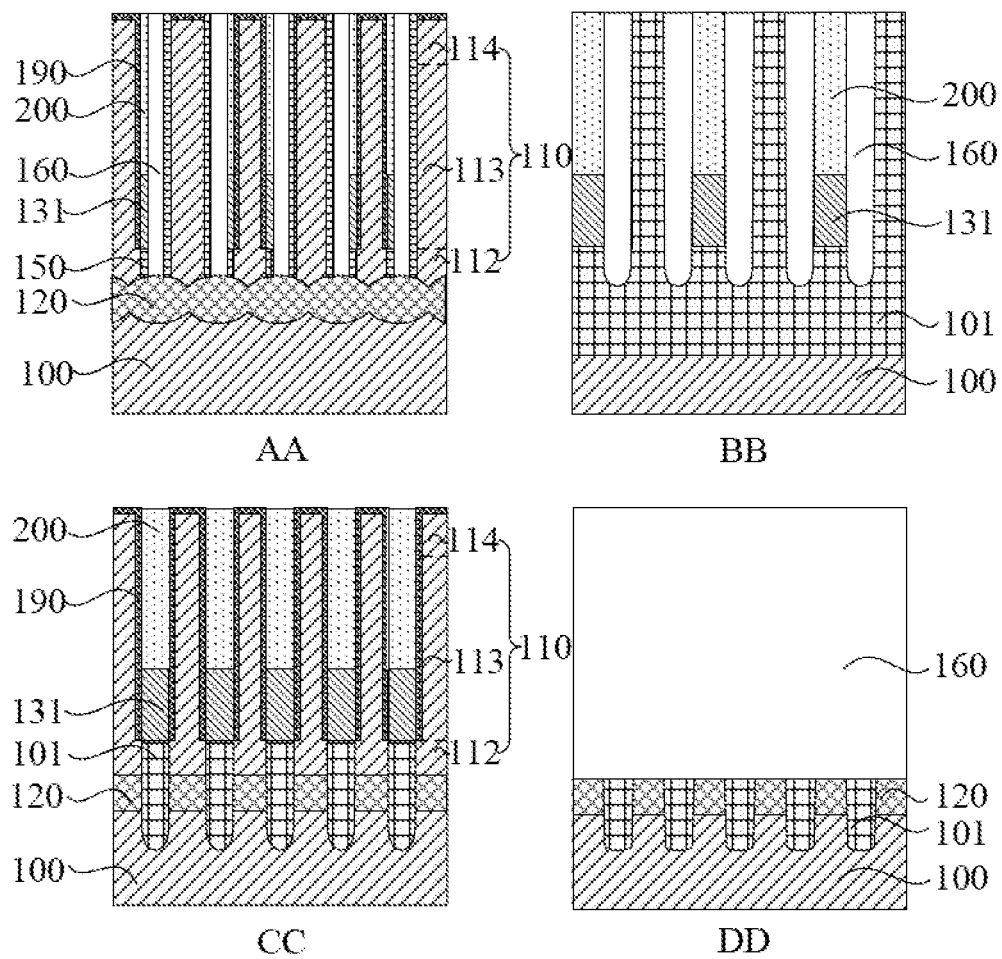

For example, with reference to FIG. 11, the operation that the second word lines 132 and the sidewall conductive layer 240 are formed may include the following operation. A first capping layer 200 is formed, in which the first capping layer 200 is located on the top surfaces of the first word lines 131. The first capping layer 200 may serve as a protective layer of the first word lines 131. The first word lines 131 are covered by the first capping layer 200 so that the subsequent process may be prevented from affecting the first word lines 131, thus improving the reliability of the semiconductor structure.

The operation that the first capping layer 200 is formed may include the following operations. A first initial capping layer is formed, in which the first initial capping layer also covers the top surface of the first gate oxide layer 190. A part of the first initial capping layer is removed by CMP until the top surface of the first gate oxide layer 190 is exposed, in which a retaining part of the first initial capping layer forms the first capping layer 200.

In some embodiments, the material of the first capping layer 200 may be an insulating material such as silicon oxynitride.

Figure 12:
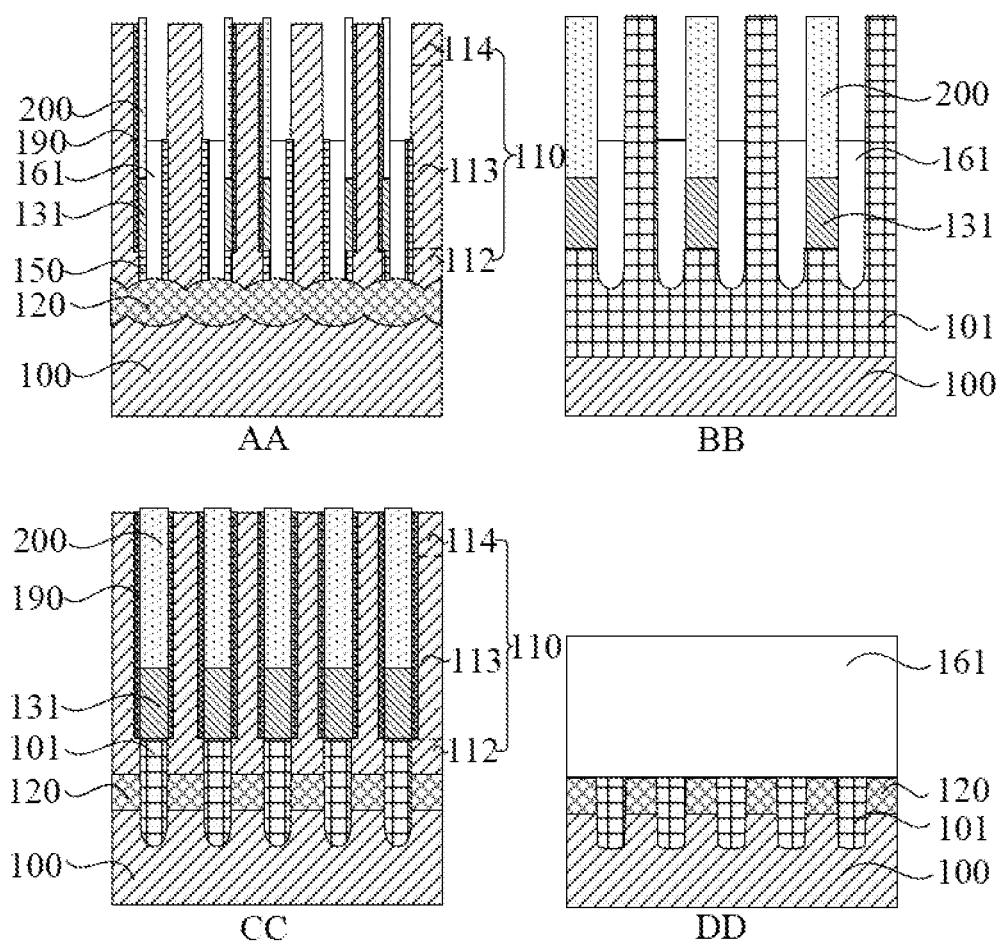

With reference to FIG. 12, a first isolation layer 161 is formed, in which the first isolation layer 161 is located between adjacent semiconductor channels 110, and the top surface of the first isolation layer 161 is higher than the top surfaces of the first word lines 131. In some embodiments, the first filling layer 160 is patterned to remove part of the first filling layer 160, in which a retaining part of the first filling layer 160 serves as the first isolation layer 161. A process basis is provided for subsequent formation of the second word lines by means of the formation of the first isolation layer 161.

The first filling layer 160 may be patterned through wet etching.

In some embodiments, after the first filling layer 160 is patterned, the first gate oxide layer 190 located on the top surfaces of the semiconductor channels 110 is removed. A part of the first gate oxide layer 190 may be removed through wet etching.

Figure 13:
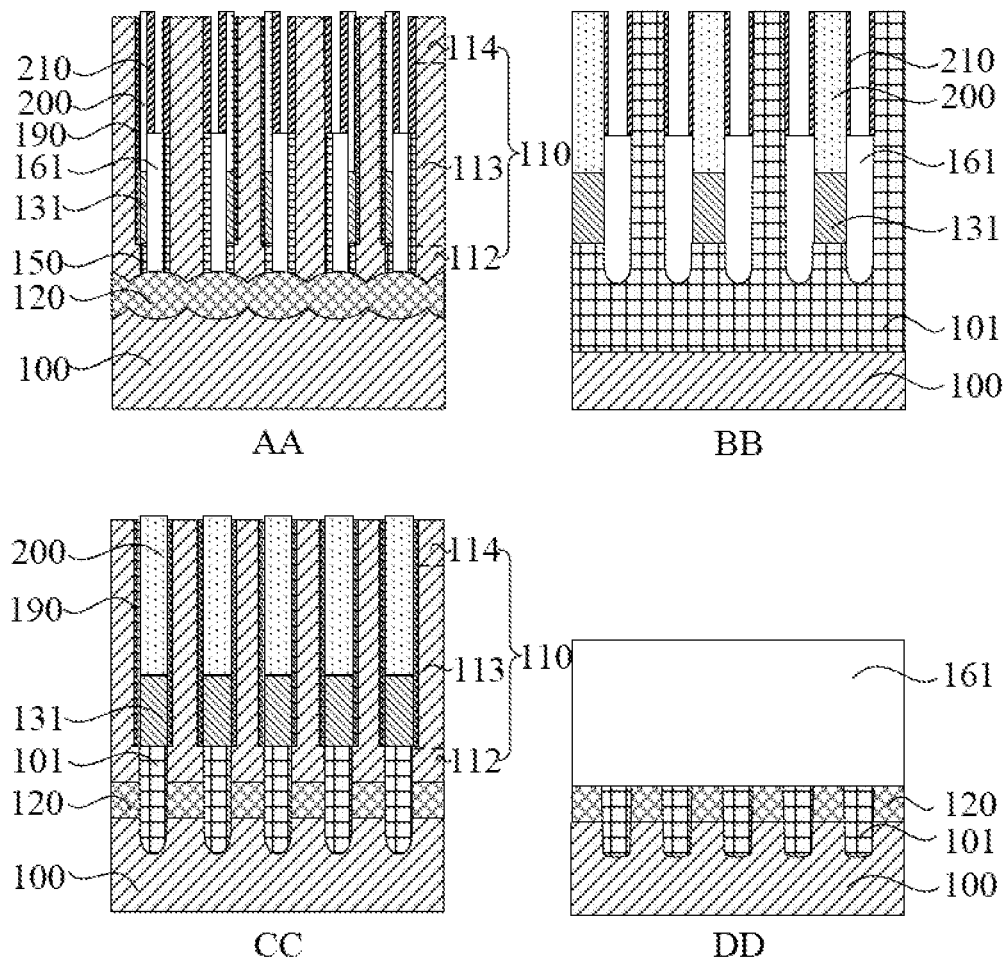

With reference to FIG. 13, a second sidewall layer 210 is formed, in which the second sidewall layer 210 covers the sidewall of the first capping layer 200 and the sidewalls of the second semiconductor channels. The second sidewall layer 210 is formed and then the second sidewall layer 210 is removed to provide a space where the second word lines 132 are formed.

The formation of the second sidewall layer 210 may include the following operations. First, oxide is deposited on the sidewall of the first capping layer 200, the sidewalls of the second semiconductor channels and the top surface of the first isolation layer 161 to form a second initial sidewall layer, and then part of the second initial sidewall layer is etched back to expose the top surface of the first isolation layer 161, in which a retaining part of the second initial sidewall layer serves as the second sidewall layer 210.

Figure 14:
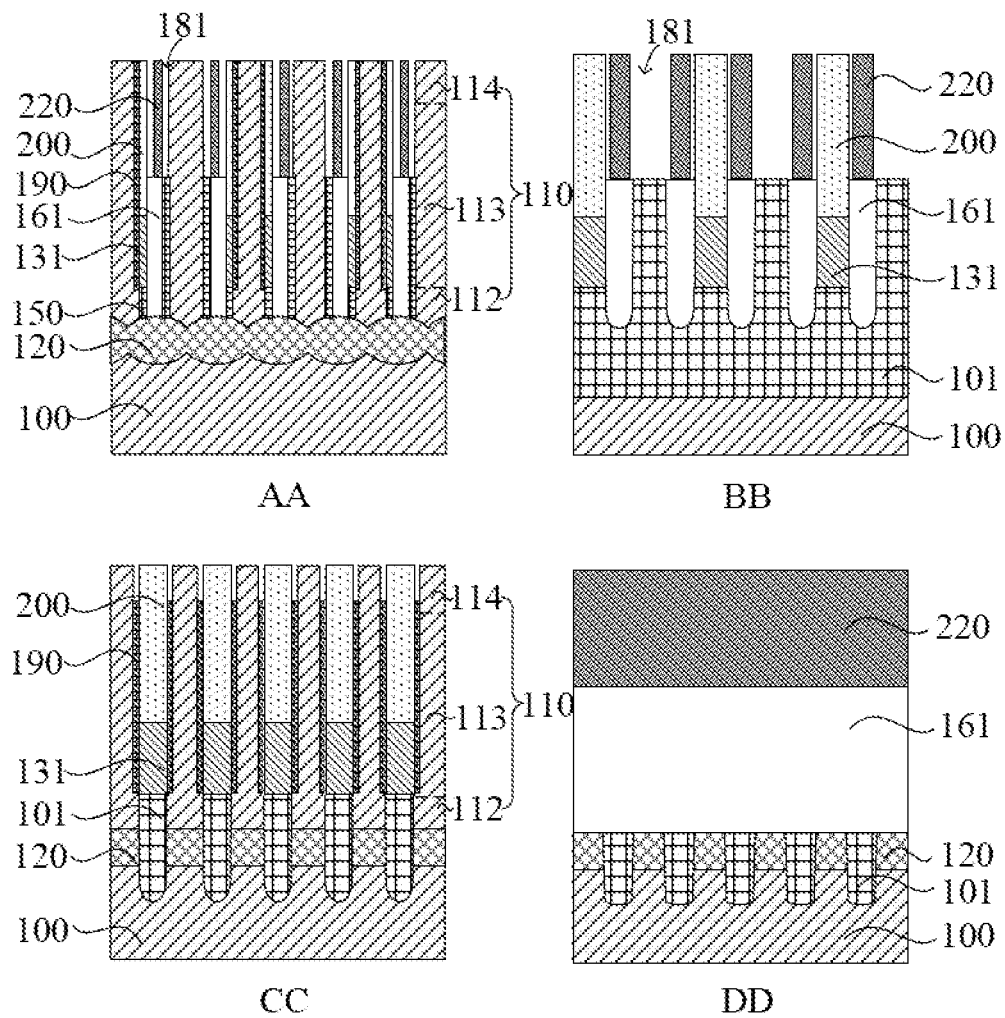

With reference to FIG. 14, a second isolation layer 220 is formed, in which the second isolation layer 220 is located on the top surface of the first isolation layer 161. One sidewall of the second isolation layer 220 is in contact with the second sidewall layer 210 (with reference to FIG. 13) covering the sidewall of the first capping layer 200, and the other sidewall of the second isolation layer 220 is in contact with the second sidewall layer 210 (with reference to FIG. 13) located on the sidewalls of the second semiconductor channels. The second sidewall layer 210 (with reference to FIG. 13) is etched back to form second trenches 181.

The operation that the second isolation layer 220 is formed may include the following operations. A second initial isolation layer is formed, in which the second initial isolation layer also covers the top surfaces of the semiconductor channels 110. A part of the second initial isolation layer is removed through CMP to expose the top surfaces of the semiconductor channels 110.

The second sidewall layer 210 (with reference to FIG. 13) is etched back through wet etching. It is to be understood that the material of the first gate oxide layer 190 may be the same as the material of the second sidewall layer 210. The operation that the second sidewall layer 210 is etched back through wet etching also includes the following operation. A part of the first gate oxide layer 190 is etched. However, since the density of the first gate oxide layer 190 is higher than the density of the second sidewall layer 210, the speeds by which the two layers are etched are different from each other. That is, the speed by which the first gate oxide layer 190 is etched is lower than the speed by which the second sidewall layer 210 is etched. Therefore, in the process of patterning the second sidewall layer 210 (with reference to FIG. 13), the depth of the removed first gate oxide layer 190 is less than the depth of the removed second sidewall layer 210.

The space in which the second word lines and a sidewall conductive layer are subsequently formed is provided by patterning the second sidewall layer 210 (with reference to FIG. 13, and the second word lines may be separated from the sidewall conductive layer through the second isolation layer 220, thus preventing the second word lines from being electrically connected to the sidewall conductive layer, and the sidewall conductive layer may shield the second word line to reduce the coupling effect between adjacent second word lines.

Figure 15:
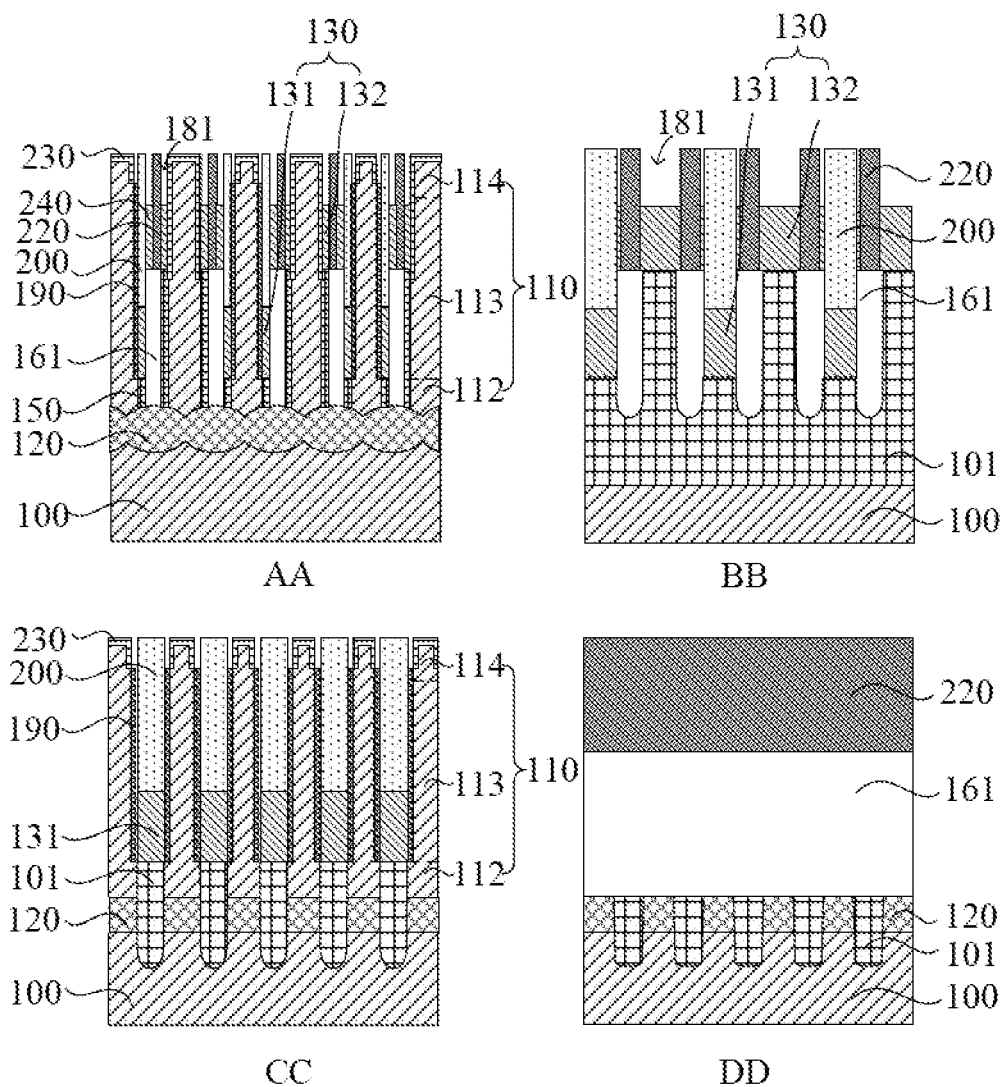

With reference to FIG. 15, the second word lines 132 located in the second trenches 181 are formed, and a sidewall conductive layer 240 is formed in the same operation, in which the sidewall conductive layer 240 and the second word lines 132 are located in different second trenches 181 (for example, located in adjacent second trenches). The material of the sidewall conductive layer 240 is the same as the material of the second word line 132, for example titanium nitride. The spacing between adjacent word lines 130 may be increased by forming the second word lines 132 spaced from the first word lines 131 while the normal operation of the semiconductor structure is ensured, so that the coupling effect between the first word lines 131 and the second word lines 132 may be reduced. Thus, the reliability of the semiconductor structure may be improved, and the sidewall conductive layer 240 may serve as a shielding layer to further improve the performance of the semiconductor structure.

The sidewall conductive layer 240 is located above one of two adjacent word lines 130, and the sidewall conductive layer 240 is arranged in the same layer as the other of the two adjacent word lines 130. In other words, the sidewall conductive layer 240 is at least located at the periphery of one word line 130 and faces said word line 130.

In some embodiments, the operation that the second word lines 132 and the sidewall conductive layer 240 are formed may further include the following operations. A second initial word line and an initial sidewall conductive layer are formed, in which different second trenches 181 are fully filled with the second initial word line and the initial sidewall conductive layer, and the second initial word line and the initial sidewall conductive layer are located on the semiconductor channels 110. Then a part of the second initial word line and a part of the initial sidewall conductive layer are removed through CMP as well as etching-back, in which a retaining part of the second initial word line serves as the second word lines 132 and a retaining part of the initial sidewall conductive layer serves as the sidewall conductive layer 240, and the second word lines 132 and the sidewall conductive layer 240 are located in the second trenches 181. The second word lines 132 with a required height and the sidewall conductive layer 240 with a required height may be formed by first depositing and then etching.

It is to be understood that sidewall conductive layers 240 are spaced apart from each other in the second direction, and one of two sidewall conductive layers 240 is located on one side of one second word line 132 of the second word lines 132 and the other of the two sidewall conductive layers 240 is located on another side of said one second word line 132.

In some embodiments, before the second word lines 132 are formed, a second gate oxide layer 230 is formed. The semiconductor channels 110 exposed by the second trenches 181 (with reference to FIG. 14) are oxidized to form the second gate oxide layer 230, and the second word lines 132 may be prevented from being in direct contact with the substrate 100 by the second gate oxide layer 230. Of course, the second gate oxide layer 230 may also be formed by deposition.

It is to be understood that part of the second gate oxide layer 230 may also be removed in the process of patterning the second sidewall layer 210 (with reference to FIG. 13), so the top surface of the second gate oxide layer 230 is also filled with a filling material of part of the second word lines 132 in the process of forming the second word lines 132. In the subsequent process of forming the second word lines 132, the second word lines 132 are etched back. In the process of etching back the second word lines 132, the filling material filled on the top surface of the second gate oxide layer 230 is removed, so that a concave hole may also be formed on the top surface of the second gate oxide layer 230.

In some embodiments, one word line 130, which is close to the surface of the substrate 100, of two word lines 130 adjacent to each other in the first direction is defined as a lower word line, and the other word line 130, which is away from the surface of the substrate 100, of the two word lines 130 adjacent to each other is defined as an upper word line. The bottom surface of the upper word line is located on a side, away from the surface of the substrate 100, of the top surface of the lower word line. In the process of forming the word lines 130, the distance between the top surface of the lower word line and the bottom surface of the upper word line is controlled to be greater than or equal to 3 nm and less than or equal to 10 nm.

It is to be noted that the lower word line here is equivalent to the first word line 131, and the upper word line is equivalent to the second word line 132. The distance between the upper word line and the lower word line may be increased by setting the distance between the bottom surface of the upper word line and the top surface of the lower word line to be greater than or equal to 3 inn, thereby improving the insulation between adjacent word lines 130, reducing the coupling effect between adjacent word lines 130, avoiding the situation that turning-on of the upper word line causes the lower word line to be turned on, and further improving the reliability of the semiconductor structure. The process difficulty may be reduced by setting the distance between the bottom surface of the upper word line and the top surface of the lower word line to be less than or equal to 10 nm.

Figure 16:
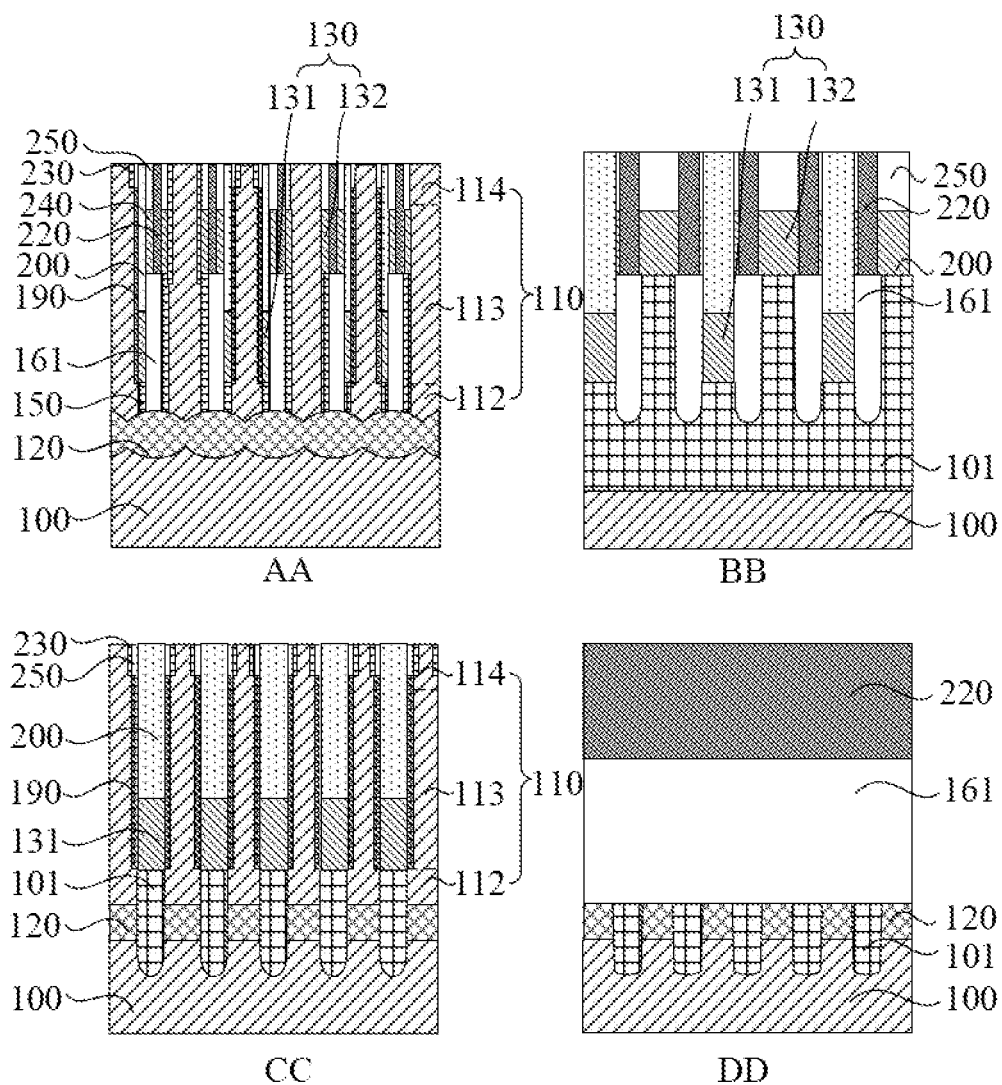

With reference to FIG. 16, FIG. 16 is a section view of manufacturing operations of a method for manufacturing a semiconductor structure according to an embodiment of the present disclosure based on FIG. 15.

In some embodiments, after the second word lines 132 are formed, a second capping layer 250 is formed. The second capping layer 250 is located on the top surfaces of the second word lines 132, and the second capping layer 250 also fills the concave hole formed on the top surface of the second gate oxide layer in the process of etching back the second word lines 132, so that the surface of the semiconductor structure is flattened. The second capping layer 250 may also serve as a protective layer of the second word lines 132. Isolation of the second word line 132 from the outside by the second capping layer may prevent the second word lines from reacting with the air, and when the semiconductor structure is affected by external force, the second capping layer 250 may also absorb part of the stress to reduce the stress effect on the second word lines 132 and improve the stability of the semiconductor structure. Based thereon, the top surfaces of the semiconductor channels 110 may be exposed by CMP.

It is to be noted that, in the embodiment of the present disclosure, "same-layer arrangement" of two film layers or structures means that the two film layers or structures are at approximately the same level relative to the substrate, one of the two film layers or structures is located on one or both sides of the other of the two film layers or structures, and the two film layers or structures are arranged approximately opposite to each other. For example, the same material and the same process may be employed to form two films or structures "arranged in the same layer" simultaneously.

In the embodiment of the disclosure, after the substrate 100, the semiconductor channels 110 and the bit lines 120 are formed, adjacent word lines 130 are spaced apart from each other in the direction perpendicular to the surface of the substrate 100, so that the spacing between adjacent word lines 130 may be increased. Accordingly, the spacing between the word lines 130 is increased, and the insulation performance between adjacent word lines 130 is improved, so that the coupling effect between adjacent word lines 130 can be improved. A shielding role may also be achieved by arranging the sidewall conductive layer 240, which in turn improves the reliability of the semiconductor structure.

Another embodiment of the present disclosure also provides a semiconductor structure, and the semiconductor structure may be formed by all or part of the above operations. The semiconductor structure provided by another embodiment of the present disclosure will be described below with reference to the drawings. It is to be noted that the same or corresponding parts of the previous embodiment may refer to the corresponding explanations of the previous embodiment, which will not be described in detail below.

Figure 17:
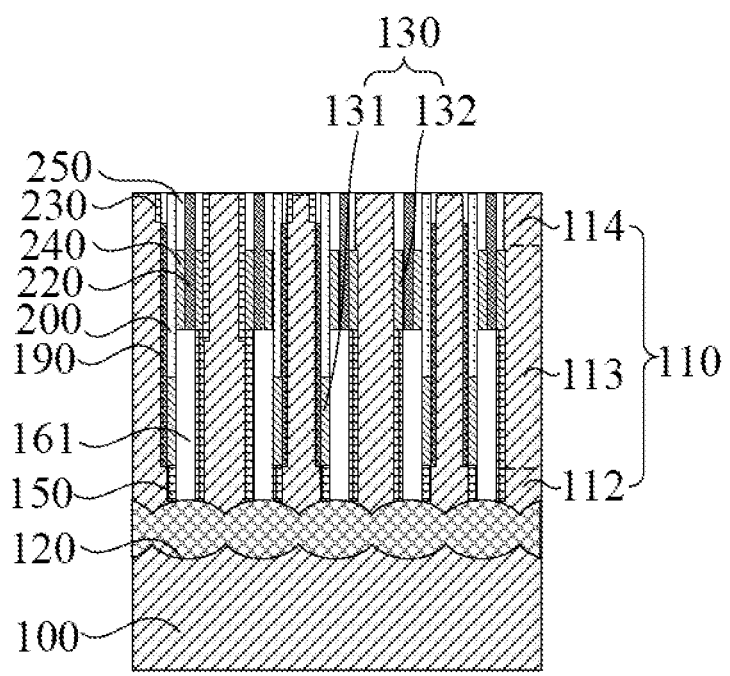
FIG. 17 is a section view of a semiconductor structure according to an embodiment of the present disclosure.

With reference to FIG. 17, the embodiment of the present disclosure provides a semiconductor structure, including: a substrate 100, a plurality of semiconductor channels 110 arrayed in a first direction and a second direction and located on the substrate 100, a plurality of bit lines 120 extending in the first direction, a plurality of word lines 130 extending in the second direction, and a sidewall conductive layer 240. The plurality of bit lines 120 are located in the substrate 100, and each of the plurality of bit lines 120 is electrically connected to a first plurality of semiconductor channels 110 arranged in the first direction. Each of the plurality of word lines 130 wraps a part of a side surface of each of a second plurality of semiconductor channels 110 arranged in the second direction. Herein, two word lines 130 adjacent to each other in the first direction are spaced apart from each other in a direction perpendicular to the surface of the substrate 100. The sidewall conductive layer 240 is located above one of the two word lines 130 adjacent to each other, and the sidewall conductive layer 240 is arranged in the same layer as the other of the two word lines 130 adjacent to each other.

The spacing between adjacent word lines 130 may be increased by arranging the word lines 130 spaced apart from each other in the direction perpendicular to the surface of the substrate 100. The insulation performance of adjacent word lines 130 may be increased by increasing the spacing between adjacent word lines 130 to reduce the coupling effect between the adjacent word lines 130, thereby improving the reliability of the semiconductor structure. By arranging the sidewall conductive layer 240, the sidewall conductive layer 240 may play a shielding role, thereby reducing the interference intensity and hither improving the performance and reliability of the semiconductor structure.

In some embodiments, the plurality of semiconductor channels 110 include: a plurality of columns of first channel groups and a plurality of columns of second channel groups. Each column of the first channel groups includes a plurality of first semiconductor channels arranged in the second direction. Each column of the second channel groups includes a plurality of second semiconductor channels arranged in the second direction. The plurality of columns of first channel groups and the plurality of columns of second channel groups are alternately arranged in the first direction. The plurality of word lines 130 include a plurality of first word lines 131 extending in the second direction and a plurality of second word lines 132 extending in the second direction. Each of the plurality of first word lines 131 wraps a part of a side surface of each of the plurality of first semiconductor channels 110 in a corresponding column of first channel groups among the plurality of columns of first channel groups. Each of the plurality of second word lines 132 wraps a part of a side surface of each of the plurality of second semiconductor channels 110 in a corresponding column of second channel groups among the plurality of columns of second channel groups. The distance between the bottom surface of each of the plurality of second word lines 132 and the surface of the substrate 100 is greater than the distance between the bottom surface of each of the plurality of first word lines 131 and the surface of the substrate 100.

The adjacent word lines 130 are divided into the first word line 131 and the second word line 132, and the word line 130 with a higher relative position may be defined as the second word line 132, and the word line 130 with a lower relative position may be defined as the first word line 131. By arranging the word lines 130 spaced apart from each other in the direction perpendicular to the substrate 100, the distance between the adjacent word lines 130 provided by the embodiment of the present disclosure is larger compared to the word lines arranged in the same layer. The insulation performance between the word lines 130 may be increased by arranging the word lines 130 with larger spacing, thereby improving the coupling effect between the adjacent word lines 130.

In other embodiments, the word line with a higher relative position may also be defined as the first word line, and the word line with a lower relative position may be defined as the second word line. The embodiment of the present disclosure is not limited to the name of the word line, as long as the word lines are spaced apart from each other in the direction perpendicular to the substrate.

In some embodiments, the bottom surfaces of the first word lines 131 are flush with each other, and the top surfaces of the first word lines 131 are flush with each other. The bottom surfaces of the second word lines 132 are flush with each other, and the top surfaces of the second word lines 132 are flush with each other. That is, for all the first word lines 131, the projections of the first word lines 131 in the first direction coincide with each other, and the projections of the second word lines 132 in the first direction coincide with each other.

By arranging the first word lines 131 flush with each other and the second word lines 132 flush with each other, the stability of the semiconductor structure may be improved, and adverse effects caused by the position of the first word lines 131 or the second word lines 132 may be avoided. Moreover, the manufacturing process may also be facilitated by arranging the first word lines 131 flush with each other and the second word lines 132 flush with each other.

It is to be noted that flush here may be regarded as that the top surfaces of the first word lines 131 are fully flush with each other, and may also be regarded as that the height difference between the top surfaces of the first word lines 131 is within an allowable error range. When the height difference between the top surfaces of the first word lines 131 is within the allowable error range, it may also be regarded that the first word lines 131 are flush with each other.

In some embodiments, the materials of the plurality of first word lines 131 may be the same. The materials of the plurality of second word lines 132 may be the same. The types of materials in the manufacturing process may be reduced by arranging the first word lines 131 with the same material and the second word lines 132 with the same material, which facilitates the control of the whole manufacturing process.

In other embodiments, the materials of the plurality of first word lines may be different from each other. The materials of the plurality of second word lines may be different from each other.

In some embodiments, the materials of the first word lines 131 may be different from the materials of the second word lines 132. It is easier to locate which operation or material causes the problem in the subsequent failure analysis by arranging the materials of the first word line 131 and the second word line 132 to be different from each other. In addition, different materials may also be selected according to the relative position relationship of the first word line 131 and the second word line 132. For example, the relative position of the first word line 131 is lower. Therefore, the subsequent electrical signal transmission with a capacitor structure needs a longer path. Therefore, the conductive path length is compensated and the performance of the semiconductor structure is improved by providing the material of the first word line 131 with better conductivity.

In other embodiments, the material of the first word line may be the same as the material of the second word line, and the embodiments of the disclosure do not limit the materials of the first word line and the second word line, as long as the performance requirements of the semiconductor structure can be met.

In some embodiments, one word line 130, which is close to the surface of the substrate 100, of the word lines 130 adjacent to each other in the first direction X is defined as a lower word line, and the other word line 130, which is away from the surface of the substrate 100, of the word lines 130 adjacent to each other is defined as an upper word line. The bottom surface of the upper word line is located on a side, away from the surface of the substrate 100, of the top surface of the lower word line. Arranging the upper word line and the lower word line may increase the spacing between word lines, thus increasing the insulation performance between adjacent word lines and further improving the reliability of the semiconductor structure.

It is to be noted that the lower word line mentioned here is equivalent to the first word line 131, and the upper word line is equivalent to the second word line 132.

In some embodiments, in the direction perpendicular to the surface of the substrate 100, the distance between the top surface of the lower word line and the bottom surface of the upper word line is greater than or equal to 3 nm and less than or equal to 10 nm. The distance between the upper word line and the lower word line may be increased by setting the distance between the bottom surface of the upper word line and the top surface of the lower word line to be greater than or equal to 3 nm, thereby improving the insulation between adjacent word lines 130, avoiding the situation that turning-on of the upper word line causes the lower word line to be turned on, and further improving the reliability of the semiconductor structure. The process difficulty may be reduced by setting the distance between the bottom surface of the upper word line and the top surface of the lower word line to be less than or equal to 10 nm.

In some embodiments, the semiconductor structure may further include a first capping layer 200, and a second capping layer 250. The first capping layer 200 is located on the top surfaces of the first word lines 131. The second capping layer 250 is located on the top surfaces of the second word lines 132. The sidewall conductive layer 240 is arranged in the same layer as the second word lines 132 and is located on the side surface of the first capping layer 200. The material of the sidewall conductive layer 240 is the same as the conductive material of the second word lines 132.

The first capping layer 200 may serve as a protective layer of the first word lines 131. By arranging the first capping layer 200, a part of the stress may be absorbed when the semiconductor structure is stressed, thereby reducing the stress on the first word lines 131, and the first capping layer 200 may also prevent other process operations from affecting the first word lines 131 during the forming process. The second capping layer 250 may serve as a protective layer of the second word lines 132, and the second capping layer 250 may also be configured to fill the semiconductor structure, thereby forming a semiconductor structure with a good appearance.

In some embodiments, the semiconductor structure may further include a first isolation layer 161 and a second isolation layer 220. The first isolation layer 161 is located between the first word lines 131 and second word lines 132 adjacent to each other, and the top surface of the first isolation layer 161 is higher than the top surfaces of the first word lines 131. The second isolation layer 220 is located on the top surface of the first isolation layer 161, and also located on the side surfaces of the second word lines 132 and the side surface of the second capping layer 250.

The first isolation layer 161 and the second isolation layer 220 may separate the second word lines 132 from the sidewall conductive layer 240, thus preventing the second word lines 132 from being electrically connected to the sidewall conductive layer 240. The poor coupling effect between adjacent word lines 130 is improved when the second word lines 132 is electrically connected to the sidewall conductive layer 240.

In some embodiments, in the direction perpendicular to the surface of the substrate 100, the dimensions of the word lines 130 are the same. The dimension here refers to the thickness of the word line 130. In other words, the difference between adjacent word lines 130 may be reduced by arranging word lines 130 with the same thickness, thus improving the reliability of the semiconductor structure.

In some embodiments, the semiconductor structure further includes a first sidewall layer 150, a first gate oxide layer 190, and a second gate oxide layer 230. The first sidewall layer 150 covers the sidewalls, which are spaced apart from each other in the first direction, of the semiconductor channels 110. The first gate oxide layer 190 is located between the first capping layer 200 and the semiconductor channels 110. The second gate oxide layer 230 is located on the sidewalls of the semiconductor channels 110.

According to the embodiment of the disclosure, a plurality of word lines 130 extending in the second direction are arranged, and each of the plurality of word lines 130 wraps a second plurality of semiconductor channels 110 arranged in the second direction to form a GAA structure. The insulation performance between adjacent word lines 130 may also be increased by arranging adjacent word lines 130 spaced apart from each other in the direction perpendicular to the surface of the substrate 100, thereby reducing the coupling effect between adjacent word lines 130. The sidewall conductive layer 240 may also serve a shielding layer to further improve the performance of the semiconductor structure.

The technical solution provided by the embodiments of the present disclosure at least has the following advantages. Adjacent word lines are spaced apart from each other in the direction perpendicular to the surface of the substrate, to increase the spacing between adjacent word lines, thereby reducing the coupling effect between adjacent word lines. The word lines wrap the side surfaces of the plurality of semiconductor channels arranged in the second direction to form a GAA transistor structure, and the sidewall conductive layer is formed so that a shielding role may be played.

Those skilled in the art may understand that the above implementation modes are specific embodiments to implement the disclosure. However, in practice, various variations may be made in form and details without departing from the spirit and scope of the embodiments of the disclosure. Any person skilled in the art may make variations and modifications without departing from the spirit and scope of the embodiments of the disclosure. Therefore, the scope of protection of the embodiments of the disclosure shall be subject to the scope defined in the claims.

What is claimed is:

1. A method for manufacturing a semiconductor structure, comprising:
   providing a substrate;
   forming a plurality of semiconductor channels arrayed in a first direction and a second direction on the substrate;
   forming a plurality of bit lines extending in the first direction, wherein the plurality of bit lines are located in the substrate, and each of the plurality of bit lines is electrically connected to a first plurality of semiconductor channels arranged in the first direction;
   forming a plurality of word lines extending in the second direction, wherein each of the plurality of word lines wraps a part of a side surface of each of a second plurality of semiconductor channels arranged in the second direction, and two word lines adjacent to each other in the first direction are spaced apart from each other in a direction perpendicular to a surface of the substrate; and
   forming a sidewall conductive layer, wherein the sidewall conductive layer is located above one of the two word lines adjacent to each other, and the sidewall conductive layer is arranged in the same layer as the other of the two word lines adjacent to each other.

2. The method for manufacturing a semiconductor structure of claim 1,
   wherein the plurality of semiconductor channels comprise a plurality of columns of first channel groups and a plurality of columns of second channel groups;
   wherein each column of the first channel groups comprises a plurality of first semiconductor channels arranged in the second direction, each column of the second channel groups comprises a plurality of second semiconductor channels arranged in the second direction, and the plurality of columns of first channel groups and the plurality of columns of second channel groups are alternately arranged in the first direction;
   wherein the plurality of word lines comprise a plurality of first word lines extending in the second direction and a plurality of second word lines extending in the second direction:
   wherein each of the plurality of first word lines wraps a part of a side surface of each of the plurality of first semiconductor channels in a corresponding column of first channel groups among the plurality of columns of first channel groups, each of the plurality of second word lines wraps a part of a side surface of each of the plurality of second semiconductor channels in a corresponding column of second channel groups among the plurality of columns of second channel groups, and a distance between a bottom surface of each of the plurality of second word lines and the surface of the substrate is greater than a distance between a bottom surface of each of the plurality of first word lines and the surface of the substrate:
   wherein forming the plurality of word lines comprises:
   forming the plurality of first word lines, and forming the plurality of second word lines.

3. The method for manufacturing a semiconductor structure of claim 2, wherein forming the plurality of first word lines comprises:
   forming first trenches, wherein each of the first trenches exposes the part of the side surface of each of the plurality of first semiconductor channels in one column;
   forming first initial word lines, wherein the first initial word lines fully fill the first trenches; and
   etching back the first initial word lines, wherein retaining parts of the first initial word lines serve as the plurality of first word lines.

4. The method for manufacturing a semiconductor structure of claim 3, wherein forming the first trenches comprises:
   forming a first sidewall layer, wherein the first sidewall layer covers sidewalls, which are spaced apart from each other in the first direction, of the plurality of semiconductor channels;
   forming a mask layer, wherein the mask layer covers the plurality of second semiconductor channels and the first sidewall layer located on the sidewalls of the plurality of second semiconductor channels; and
   patterning the first sidewall layer with the mask layer as a mask to form the first trenches.

5. The method for manufacturing a semiconductor structure of claim 3, wherein the plurality of second word lines and the sidewall conductive layer are simultaneously formed, wherein forming the plurality of second word lines and the sidewall conductive layer comprises:
   forming a first capping layer, wherein the first capping layer is located on top surfaces of the plurality of first word lines;
   forming a first isolation layer, wherein the first isolation layer is located between adjacent semiconductor channels, and a top surface of the first isolation layer is higher than the top surfaces of the plurality of first word lines;
   forming a second sidewall layer, wherein the second sidewall layer covers a sidewall of the first capping layer and sidewalls of the plurality of second semiconductor channels:
   forming a second isolation layer, wherein the second isolation layer is located on the top surface of the first isolation layer, one sidewall of the second isolation layer is in contact with the second sidewall layer covering the sidewall of the first capping layer, and the other sidewall of the second isolation layer is in contact with the second sidewall layer located on the sidewalls of the plurality of second semiconductor channels:
   etching back the second sidewall layer to form second trenches; and
   forming the plurality of second word lines and the sidewall conductive layer, wherein the plurality of second word lines and the sidewall conductive layer are located in different second trenches.

6. The method for manufacturing a semiconductor structure of claim 2, wherein after the plurality of second word lines are formed, the method further comprises:
   forming a second capping layer, wherein the second capping layer is located on top surfaces of the plurality of second word lines.

7. The method for manufacturing a semiconductor structure of claim 1, wherein one word line, which is close to the surface of the substrate, of the two word lines adjacent to each other in the first direction is defined as a lower word line, and the other word line, which is away from the surface of the substrate, of the two word lines adjacent to each other is defined as an upper word line;
   wherein a bottom surface of the upper word line is located on a side, away from the surface of the substrate, of a top surface of the lower word line;
   wherein in a process of forming the plurality of word lines, a distance between the top surface of the lower word line and the bottom surface of the upper word line is controlled to be greater than or equal to 3 nm and less than or equal to 10 nm.

8. The method for manufacturing a semiconductor structure of claim 1, wherein each of the plurality of semiconductor channels comprises a first doped region, a channel region and a second doped region which are sequentially arranged, the first doped region is electrically connected to one of the plurality of bit lines, and doping type of the first doped region, doping type of the channel region and doping type of the second doped region are the same.

9. The method for manufacturing a semiconductor structure of claim 1, wherein forming the plurality of semiconductor channels arrayed in the first direction and the second direction on the substrate comprises:
   patterning the substrate to form a plurality of initial semiconductor channels spaced apart from each other in the second direction; and
   patterning the plurality of initial semiconductor channels to form the plurality of semiconductor channels spaced apart from each other in each of the first direction and the second direction.

10. The method for manufacturing a semiconductor structure of claim 1, wherein a material of each of the plurality of semiconductor channels is silicon, wherein the plurality of bit lines are formed by a silicide process.

11. A semiconductor structure, comprising:
   a substrate as well as a plurality of semiconductor channels arrayed in a first direction and a second direction and formed on the substrate:
   a plurality of bit lines extending in the first direction, wherein the plurality of bit lines are located in the substrate, and each of the plurality of bit lines is electrically connected to a first plurality of semiconductor channels arranged in the first direction:
   a plurality of word lines extending in the second direction, wherein each of the plurality of word lines wraps a part of a side surface of each of a second plurality of semiconductor channels arranged in the second direction, wherein two word lines adjacent to each other in the first direction are spaced apart from each other in a direction perpendicular to a surface of the substrate; and
   a sidewall conductive layer, wherein the sidewall conductive layer is located above one of the two word lines adjacent to each other, and the sidewall conductive layer is arranged in the same layer as the other of the two word lines adjacent to each other.

12. The semiconductor structure of claim 11, wherein the plurality of semiconductor channels comprise:
   a plurality of columns of first channel groups and a plurality of columns of second channel groups, wherein each column of the first channel groups comprises a plurality of first semiconductor channels arranged in the second direction, each column of the second channel groups comprises a plurality of second semiconductor channels arranged in the second direction, and the plurality of columns of first channel groups and the plurality of columns of second channel groups are alternately arranged in the first direction:
   wherein the plurality of word lines comprise:
   a plurality of first word lines extending in the second direction, wherein each of the plurality of first word lines wraps a part of a side surface of each of the plurality of first semiconductor channels in a corresponding column of first channel groups among the plurality of columns of first channel groups; and
   a plurality of second word lines extending in the second direction, wherein each of the plurality of second word lines wraps a part of a side surface of each of the plurality of second semiconductor channels in a corresponding column of second channel groups among the plurality of columns of second channel groups, and a distance between a bottom surface of each of the plurality of second word lines and the surface of the substrate is greater than a distance between a bottom surface of each of the plurality of first word lines and the surface of the substrate.

13. The semiconductor structure of claim 12, wherein the bottom surfaces of the plurality of first word lines are flush with each other, top surfaces of the plurality of first word lines are flush with each other, and wherein the bottom surfaces of the plurality of second word lines are flush with each other, and top surfaces of the plurality of second word lines are flush with each other.

14. The semiconductor structure of claim 12, wherein the materials of the plurality of first word lines are the same, and the materials of the plurality of second word lines are the same.

15. The semiconductor structure of claim 12, wherein materials of the plurality of first word lines are different from materials of the plurality of second word lines.

16. The semiconductor structure of claim 12, further comprising:
a first capping layer and a second capping layer, wherein the first capping layer is located on top surfaces of the plurality of first word lines, and the second capping layer is located on top surfaces of the plurality of second word lines, wherein the sidewall conductive layer is arranged in the same layer as the plurality of second word lines and is located on a side surface of the first capping layer, and a material of the sidewall conductive layer is the same as a conductive material of the plurality of second word lines.

17. The semiconductor structure of claim 16, further comprising:
a first isolation layer and a second isolation layer, wherein the first isolation layer is located between the plurality of first word lines and the plurality of second word lines adjacent to each other, and a top surface of the first isolation layer is higher than the top surfaces of the plurality of first word lines, wherein the second isolation layer is located on the top surface of the first isolation layer, and is located on side surfaces of the plurality of second word lines and a side surface of the second capping layer.

18. The semiconductor structure of claim 11, wherein one word line, which is close to the surface of the substrate, of the two word lines adjacent to each other in the first direction is defined as a lower word line, and the other word line, which is away from the surface of the substrate, of the two word lines adjacent to each other is defined as an upper word line; and wherein a bottom surface of the upper word line is located on a side, away from the surface of the substrate, of a top surface of the lower word line.

19. The semiconductor structure of claim 18, wherein in the direction perpendicular to the surface of the substrate, a distance between the top surface of the lower word line and the bottom surface of the upper word line is greater than or equal to 3 nm and less than or equal to 10 nm.

20. The semiconductor structure of claim 11, wherein in the direction perpendicular to the surface of the substrate, dimensions of the plurality of word lines are the same.

* * * * *